United States Patent
Metaxas et al.

(10) Patent No.: US 8,548,218 B2
(45) Date of Patent: Oct. 1, 2013

(54) IMAGE RECONSTRUCTION

(76) Inventors: Dimitris Metaxas, Princeton, NJ (US);
Junzhou Huang, Grapevine, TX (US)

(*) Notice: Subject to any disclaimer, the term of this patent is extended or adjusted under 35 U.S.C. 154(b) by 0 days.

(21) Appl. No.: 13/239,129

(22) Filed: Sep. 21, 2011

(65) Prior Publication Data

US 2012/0155730 A1    Jun. 21, 2012

Related U.S. Application Data

(60) Provisional application No. 61/384,860, filed on Sep. 21, 2010.

(51) Int. Cl.
*G06K 9/00* (2006.01)

(52) U.S. Cl.
USPC .......................................... 382/131; 382/128

(58) Field of Classification Search
None
See application file for complete search history.

(56) References Cited

U.S. PATENT DOCUMENTS

| | | | |
|---|---|---|---|
| 7,860,291 B2 * | 12/2010 | Hwang | 382/131 |
| 2009/0105582 A1 * | 4/2009 | Dougherty et al. | 600/420 |
| 2009/0224756 A1 * | 9/2009 | Machida et al. | 324/300 |
| 2009/0224759 A1 * | 9/2009 | Kholmovski et al. | 324/310 |
| 2009/0285463 A1 * | 11/2009 | Otazo et al. | 382/131 |
| 2011/0044524 A1 * | 2/2011 | Wang et al. | 382/131 |

OTHER PUBLICATIONS

Motion Correction Using an Enhanced Floating Navigator and GRAPPA Operations Wei Lin,1* Feng Huang,1 Peter Börnert,2 Yu Li,1 and Arne Reykowski; Nov. 2009.*
An Efficient Algorithm for Compressed MR Imaging using Total Variation and Wavelets Shiqian Ma et al ; IEEE Mar. 2008.*

* cited by examiner

*Primary Examiner* — Nancy Bitar
(74) *Attorney, Agent, or Firm* — Fox Rothschild LLP

(57) ABSTRACT

A system and method of reconstructing an image through solution of a data fitting problem, wherein the data fitting problem is not susceptible to efficient solution as a whole, is disclosed, which may comprise gathering, via a computing device, k-space image data, selecting a data fitting problem solution algorithm for the k-space data, decomposing the data fitting problem solution into a plurality of sub-problem solutions each susceptible to efficient solution separately for the k-space data, obtaining, via the computing device, the plurality of sub-problem solutions for the k-space data, and reconstructing, via the computing device, the image based upon a weighted average of the plurality of sub-problem solutions for the k-space data. The image may be a magnetic resonance image. The data fitting problem may comprise a minimization of a plurality of linear terms of a least square data fitting solution. The image may comprise under-sampled k-space image data.

18 Claims, 9 Drawing Sheets

(a)    (b)    (c)    (d)

(a)  (b)  (c)  (d)

IMAGE RECONSTRUCTION

CROSS-REFERENCE TO RELATED APPLICATIONS

This application claims priority to U.S. Provisional application Ser. No. 61/384,860, filed on Sep. 21, 2010, entitled, IMAGE RECONSTRUCTION, the disclosure of which is hereby incorporated by reference in its entirety for all purposes, as if actually entirely reproduced herein.

FIELD OF THE INVENTION

The disclosed subject matter relates to image reconstruction, particularly to magnetic resonance image reconstruction from compressed magnetic resonance image data.

BACKGROUND OF THE INVENTION

Magnetic Resonance (MR) Imaging has been widely used in medical diagnosis because of its non-invasive manner and excellent depiction of soft tissue changes. Recent developments in compressive sensing theory (see, e.g., Candes, et al., Robust uncertainty principles: Exact signal reconstruction from highly incomplete frequency information, IEEE Transactions on Information Theory, 52, 489-509 (2006) (Candes et al., 2006, the disclosure of which is hereby incorporated by reference in its entirety for all purposes, as if actually entirely reproduced herein), Donoho, Compressed sensing, IEEE Transactions on Information Theory, 52, 1289-1306 (2009) (Donoho, 2006, the disclosure of which is hereby incorporated by reference in its entirety for all purposes, as if actually entirely reproduced herein) show that it is possible to accurately reconstruct, e.g. Magnetic Resonance ("MR") Images from, e.g., highly under-sampled K-space data and therefore significantly reduce the scanning duration.

Suppose x is an MR image and R is a partial Fourier transform, the sampling measurement b of x in K-space can be defined as b=Rx. The compressed MR image reconstruction problem ("problem (1)") can be viewed as one to reconstruct x given the measurement b and the sampling matrix R. Motivated by the compressive sensing theory, Lustig et al., Sparse MRI: The application of compressed sensing for rapid MR imaging, Magnetic Resonance in Medicine, 58, 1182-1195 (2007) (Lustig et al., 2007, the disclosure of which is hereby incorporated by reference in its entirety for all purposes, as if actually entirely reproduced herein) proposed effectively reconstructing MR images with only 20% sampling.

The improved results were obtained by having both a wavelet transform and a discrete gradient in the objective, which can be formulated as follows:

$$\hat{x} = \underset{x}{\operatorname{argmin}}\left\{\frac{1}{2}\|Rx - b\|^2 + \alpha\|x\|_{TV} = \beta\|\Phi_x\|_1\right\} \quad (1)$$

where $\alpha$ and $\beta$ are two positive parameters, b is the under-sampled measurements of k-space data, R is a partial Fourier transform and $\Phi$ is a wavelet transform. This reconstruction can be based on the fact that piecewise smooth MR images of organs can be sparsely represented by the wavelet basis and should have small total variations.

The total variation ("TV") can be viewed discretely as:

$$\|x\|_{TV} = \sum_i \sum_j \sqrt{((\nabla_1 x_{ij})^2 + (\nabla_2 x_{ij})^2)}$$

where $\nabla_1$ and $\nabla_2$ denote the forward finite difference operators on the first and second coordinates, respectively. Partial differential equation ("PDE"), (He, et al, MR image reconstruction by using the iterative refinement method and nonlinear inverse scale space methods. Technical Report UCLA CAM 06-35 (2006) (He et al., 2006, the disclosure of which is hereby incorporated by reference in its entirety for all purposes, as if actually entirely reproduced herein)) methods have been used to attack it. However, they are slow and impractical for real MR images. Computation need not become the bottleneck that can prevent such a model, as discussed in He et al., 2006, from being used in practical MR image reconstruction. Therefore, a problem to be addressed in compressed MR image reconstruction is to develop efficient algorithms to solve this problem with equivalent or better reconstruction accuracy.

Other methods tried to reconstruct compressed MR images by performing $L_p$-quasinorm (p=1) regularization optimization (See, e.g., Ye, et al., Projection reconstruction MR imaging using focuss, Magnetic Resonance in Medicine, 57, 764-775 (2007) (Ye et al., 2007, the disclosure of which is hereby incorporated by reference in its entirety for all purposes, as if actually entirely reproduced herein)); Chartrand, Exact reconstruction of sparse signals via nonconvex minimization, IEEE Signal Processing Letters, 14, 707-710 (2007) (Chartrand, 2007, the disclosure of which is hereby incorporated by reference in its entirety for all purposes, as if actually entirely reproduced herein); Chartrand, Fast algorithms for nonconvex compressive sensing: MRI reconstruction from very few data, Proceedings of the Sixth IEEE International Conference on Symposium on Biomedical Imaging, IEEE Press, pp. 262-265 (2009) (Chartrand, 2009, the disclosure of which is hereby incorporated by reference in its entirety for all purposes, as if actually entirely reproduced herein). Although a bit higher compression ratio may be achieved, these non-convex methods do not always give global minima and are also relatively slow. Trzasko et al., Highly under-sampled magnetic resonance image reconstruction via homotropic $l_0$-minimization, IEEE Transactions on Medical Imaging, 28, 106-121 (2009) (Trzasko et al., 2009, the disclosure of which is hereby incorporated by reference in its entirety for all purposes, as if actually entirely reproduced herein), discussing homotopic non-convex $l_0$-minimization to reconstruct MR images. They created a gradual non-convex objective function which may allow global convergence with designed parameters. It was faster than those $L_p$-quasinorm regularization methods. However, it still needed 1-3 minutes to obtain reconstructions of 256×256 images in MAT-LAB on a 3 GHz desktop computer.

Recently, two fast methods were proposed to directly solve the above noted iterative refinement method and nonlinear inverse scale space MRI image reconstruction "Problem 1" solution model. In Ma, et al., An efficient algorithm for compressed MR imaging using total variation and wavelets, In IEEE Conference on Computer Vision and Pattern Recognition, CVPR 2008, pp. 1-8 (2008) (Ma et al., 2008), an operator-splitting algorithm (TVCMRI) was proposed to solve the above noted MR image reconstruction problem. In Yang, et al. A fast alternating direction method for TV/1-/2 signal reconstruction from partial Fourier data, IEEE Journal of Selected Topics in Signal Processing, special Issue on compressive Sensing, 4, pp 288-297 (2010) (Yang et al., 2010, the disclosure of which is hereby incorporated by reference in its entirety for all purposes, as if actually entirely reproduced herein), a variable splitting method (RecPF) was proposed to solve the MR image reconstruction problem. Both can be used to replace iterative linear solvers with Fourier domain computations, which can gain substantial time savings. In MATLAB on a 3 GHz desktop computer, they can be used to obtain good reconstructions of 256×256 images in ten seconds or less. They are two of the fastest MR image reconstruction methods so far.

The iterative refinement method and nonlinear inverse scale space MRI image reconstruction solution model can be interpreted as a special case of general optimization problems consisting of a loss function and convex functions as priors. Two classes of algorithms to solve this generalized problem are operator-splitting algorithms and variable-splitting algorithms. Operator-splitting algorithms search for an x that makes the sum of the corresponding maximal-monotone operators equal to zero. These algorithms can use Forward-Backward schemes Gabay, Chapter IX applications of the method of multipliers to variational inequalities, Studies in Mathematics and its Applications 15, 299-331 (1983) (Gabay, 1983, the disclosure of which is hereby incorporated by reference in its entirety for all purposes, as if actually entirely reproduced herein); Combettes, et al., Signal recovery by proximal forward-backward splitting, SIAM Journal on Multiscale Modeling and Simulation 19, 1.107-1130 (2008), (Combettes, et al. 2008, the disclosure of which is hereby incorporated by reference in its entirety for all purposes, as if actually entirely reproduced herein); Tseng, A modified forward-backward splitting method for maximal monotone mappings, SIAM Journal on Control and Optimization, 38, 431-446, 2000 (Tseng, 2000, the disclosure of which is hereby incorporated by reference in its entirety for all purposes, as if actually entirely reproduced herein), Douglas-Rachford splitting schemes, Spingarn, Partial inverse of a monotone operator, Applied Mathematics and Optimization, 10, pp. 247-265 (1983), (Spingarn, 1983, the disclosure of which is hereby incorporated by reference in its entirety for all purposes, as if actually entirely reproduced herein) and projective splitting schemes Eckstein, et al., General projective splitting methods for sums of maximal monotone operators, SIAM Journal on Control Optimization, 48, 787-811 (Eckstein, et al., 2009, the disclosure of kyhich is hereby incorporated by reference in its entirety for all purposes, as if actually entirely reproduced herein).

The Iterative Shrinkage-Thresholding Algorithm (ISTA) and Fast ISTA (FISTA) Beck, et al., A fast iterative shrinkage-thresholding algorithm for linear inverse problems, SIAM Journal on Imaging Sciences 2, 183-202 (2009) (Beck, et al. 2009 II, the disclosure of which is hereby incorporated by reference in its entirety for all purposes, as if actually entirely reproduced herein) are two well known operator-splitting algorithms, which have been successfully used in signal processing. Beck, et al., Fast gradient-based algorithms for constrained total variation image demising and deblurring problems, IEEE Transaction on Image Processing 18, 2419-2434, 2009 (Beck, et al. 2009 I, the disclosure of which is hereby incorporated by reference in its entirety for all purposes, as if actually entirely reproduced herein), and Beck et al, 2009 II) and multi-task learning, Ji et al., An accelerated gradient method for trace norm minimization, in: ICML '09 Proceedings of the 26th Annual International Conference on Machine Learning, pp. 457-464 (2009), (Ji 2009).

Variable splitting algorithms, on the other hand, are based on combinations of alternating direction methods (ADM) under an augmented Lagrangian framework. It is firstly used to solve the PDE problem in Gabay, et al. A dual algorithm for the solution of nonlinear variational problems via finite-element approximations, Computers and Mathematics with Applications 2, 17-40 (1976) (Gabay, et al. 1976, the disclosure of which is hereby incorporated by reference in its entirety for all purposes, as if actually entirely reproduced herein); Glowinski, et al., Augmented Lagrangian and operator-splitting methods in nonlinear mechanics, Society for Industrial Mathematics, 9 (1989) (Glowinski, et al., 1989, the disclosure of which is hereby incorporated by reference in its entirety for all purposes, as if actually entirely reproduced herein). Tseng et al. extended it to solve variational inequality problems, Tseng, Applications of a splitting algorithm to decomposition in convex programming and variational inequalities, SIAM Journal on Control and Optimization, 29, 119-138, 1991, (Tseng, 1991, the disclosure of which is hereby incorporated by reference in its entirety for all purposes, as if actually entirely reproduced herein); He, et al. A new inexact alternating direction method for monotone variational inequalities. Mathematical Programming 92, 103-118 (He et al., 2002 II, the disclosure of which is hereby incorporated by reference in its entirety for all purposes, as if actually entirely reproduced herein). Wang et al., A new alternating minimization algorithm for total variation image reconstruction, SIAM Journal on Imaging Sciences, 1, pp. 248-272 (2008), (Wang et al. 2008, the disclosure of which is hereby incorporated by reference in its entirety for all purposes, as if actually entirely reproduced herein) showed that the ADMs are very efficient for solving TV regularization problems. They also outperform previous interior-point methods on some structured SDP problems, Malick, et al., Regularization methods for semidefinite programming, SIAM Journal on Optimization, 20, pp. 336-356, (2009), (Malick et al., 2009, the disclosure of which is hereby incorporated by reference in its entirety for all purposes, as if actually entirely reproduced herein).

Two variable-splitting algorithms, namely the Multiple Splitting Algorithm (MSA) and Fast MSA (FaMSA), have been recently proposed to efficiently solve the above noted iterative refinement method and nonlinear inverse scale space MRI image reconstruction solution model while all convex functions are assumed to be smooth Goldfarb, et al. Fast Multiple Splitting Algorithms for Convex Optimization, Technical Report, Department of IEOR, Columbia University, New York (2009) (Goldfarb, et al., 2009, the disclosure of which is hereby incorporated by reference in its entirety for all purposes, as if actually entirely reproduced herein).

However, all these above-mentioned algorithms cannot efficiently solve the above noted iterative refinement method and nonlinear inverse scale space MRI image reconstruction model problem with provable convergence complexity. Moreover, none of them can provide the complexity bounds of iterations for their problems, except ISTA/FISTA, as discussed in Beck, et al., 2009 II, the disclosure of which is hereby incorporated by reference in its entirety for all purposes, as if actually entirely reproduced herein, and MSA/FaMSA, as discussed in Goldfarb, et al. 2009, the disclosure of which is hereby incorporated by reference in its entirety for all purposes, as if actually entirely reproduced herein. Both ISTA and MSA are first order methods. Their complexity bounds are $\mathcal{O}(1/\epsilon)$ for $\epsilon$-optimal solutions. Their fast versions, FISTA and FaMSA, have complexity bounds $\mathcal{O}(1/\sqrt{\epsilon})$, which are inspired by the seminal results of Nesterov and are optimal according to the conclusions of Nesterov, Nesterov, A method for solving the convex programming problem with convergence rate o(1/k²), Dokl. Akad. Nauk SSSR. 269, 543-547, 1983, (Nesterov, 1983, the disclosure of which is hereby incorporated by reference in its entirety for all purposes, as if actually entirely reproduced herein, Nesterov, Gradient methods for minimizing composite objective function, Technical report at www.ecore.beDPs/dp1191313936.pdf. Nesterov, 2007, the disclosure of which is hereby incorporated by reference in its entirety for all purposes, as if actually entirely reproduced herein).

However, both ISTA and FISTA are designed for simpler regularization problems and cannot be applied efficiently to the composite regularization problem iterative refinement method and nonlinear inverse scale space MRI image reconstruction model problem using both L1 and TV norm. While the MSA/FaMSA methods assume that all convex functions are smooth, it makes them unable to directly solve the iterative refinement method and nonlinear inverse scale space MRI image reconstruction model problem, as the non-smooth function must be smoothed first before applying them. Since the smooth parameters are related to $\epsilon$, the FaMSA with complexity bound $\mathcal{O}(1/\sqrt{\epsilon})$ requires $\mathcal{O}(1/\epsilon)$ iterations to compute an $\epsilon$-optimal solution, which means that it is not optimal for the iterative refinement method and nonlinear inverse scale space MRI image reconstruction model problem.

A formalism widely used in magnetic resonance imaging is k-space. Simply speaking, k-space is the temporary image space in which data from digitized MR signals are stored during data acquisition. When k-space is full (at the end of the scan), the data can be mathematically processed to produce a final image. Thus k-space holds raw data before reconstruction. The so-called k-space is in the spatial frequency domain. Thus if one defines $k_{FE}$ and $k_{PE}$ such that $k_{FE}=\bar{\gamma}G_{FE}m\Delta t$ and $k_{PE}=\bar{\gamma}n\Delta G_{FE}\tau$, where FE refers to frequency encoding. PE to phase encoding, $\Delta t$ is the sampling time (the reciprocal of sampling frequency), $\tau$ is the duration of $G_{PE}$, $\bar{\gamma}$ is the gyromagnetic ratio, in is the sample number in the FE direction and n is the sample number in the PE direction (also known as partition number), the 2D-Fourier Transform of this encoded signal results in a representation of the spin density distribution in two dimensions. Thus position (x, y) and spatial frequency ($k_{FE}$, $k_{FE}$) constitute a Fourier transform pair. The so-called k-space can have the same number of rows and columns as the final image. During the scan, k-space can be filled with raw data one line per TR (Repetition Time).

Although a strict mathematical proof does not exist and counterexamples can be provided, in most cases it is safe to say that data in the middle k-space (high frequency information) contains the signal to noise and contrast information for the image, while data around the outside of the image (low frequency information) contains all the information about the image resolution. This is the basis for advanced scanning techniques, such as the keyhole acquisition, in which a first complete k-space is acquired, and subsequent scans are performed by acquiring: just the central part of the k-space, In this way, different contrast images can be acquired without the need of running full scans.

A symmetry property exists in k-space, descending from the fact that the object imaged is a contrast-weighted proton density and thus a real quantity, relating the signal at two opposite locations in k-space:

$S(-k_{FE}, -k_{PE}) = S^*(k_{FE}, k_{PE})$ where the star (*) denotes complex conjugation. Thus k-space information is somewhat redundant, and an image can be reconstructed using only one half of the k-space, either in the PE (Phase Encode) direction saving scan time (such a technique is known as half Fourier or half scan) or in the FE (Frequency Encode) direction, allowing for lower sampling frequencies and/or shorter echo times (such a technique is known as half echo). However, these techniques are approximate due to remaining phase errors in the MRI data which can rarely be completely controlled.

SUMMARY OF THE INVENTION

A system and method of reconstructing an image through solution of a data fitting problem, wherein the data fitting problem is not susceptible to efficient solution as a whole, is disclosed, which may comprise gathering, via a computing device, k-space image data, selecting a data fitting problem solution algorithm for the k-space data, decomposing the data fitting problem solution into a plurality of sub-problem solutions each susceptible to efficient solution separately for the k-space data, obtaining, via the computing device, the plurality of sub-problem solutions for the k-space data, and reconstructing, via the computing device, the image based upon a weighted average of the plurality of sub-problem solutions for the k-space data. The image may be a magnetic resonance image. The data fitting problem may comprise a minimization of a plurality of linear terms of a least square data fitting solution. The image may comprise under-sampled k-space image data. The fitting problem may comprises a composite regularization problem. The system and method may further comprise decomposing the composite regularization problem by splitting a variable into separate variables, and performing operator splitting on each of the sub-problems. The image may comprise a magnetic resonance image comprising more samples within a first frequency band than within a second frequency band. The first frequency band may comprise lower frequencies than the second frequency band. The system and method may comprise minimizing, via the computing device, a linear combination of three terms corresponding to a least square data fitting, a total variation (TV) and an L1 normalization regularization. The system and method may comprise decomposing a problem solution into the TV and L1 normalization regularization sub-problems respectively; and solving, via the computing device, the sub-problems.

The system and method may comprise solving $x^k = \text{prox}_\rho (\alpha \|x\|_{TV} + \beta \|\Phi x\|_1)(x_g)$, via a computing device, where x is an unknown target, k is an integer from 1 to K, $\rho$ is a scaling factor, $\alpha$ and $\beta$ are two positive regularization parameters and $\Phi x$ is a wavelet transform; and applying, via the computing device, FISTA to the results to obtain a $\epsilon$-optimal solution.

DETAILED DESCRIPTION OF THE INVENTION

Figure 1:
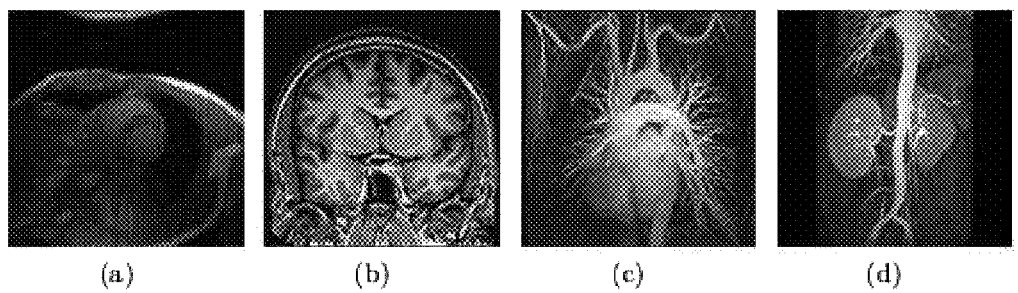
FIG. 1 shows 2D MRI images illustrating the effectiveness of aspects of embodiments of the disclosed subject matter. (a) Cardiac MR images; (b) Brain MR images; (c) Chest MR images; (d) Artery MR images.

According to aspects of embodiments of the disclosed subject matter, it is proposed to apply a more efficient algorithm for MR image reconstruction. The algorithm can, e.g., minimize a linear combination of three terms corresponding to a least square data fitting, total variation (TV) and L1 normalization regularization. Applicants have found this approach to be very powerful for MR image reconstruction. According to aspects of the disclosed subject matter, it is proposed to first decompose the original iterative refinement method and nonlinear inverse scale space MRI image reconstruction problem into L1 and TV normalization regularization sub-problems respectively. Then, the two sub-problems can be efficiently solved by existing techniques. Finally, a reconstructed image can be obtained from the weighted average of solutions from two sub-problems in an iterative framework. Applicants have found that the system and method according to the disclosed subject matter for compressed MR image reconstruction provides for superior performance.

Also according to aspects of the disclosed subject matter, the optimization algorithm for MR image reconstruction can be based on the combination of both variable and operator splitting techniques. The algorithm can serve to decompose the hard composite regularization iterative refinement method and nonlinear inverse scale space MRI image reconstruction problem into two simpler regularization sub-problems by: 1) splitting variable x into two variables $\{x_i\}_{i=1,2}$; 2) thus performing operator splitting to minimize total variation regularization, and L1 normalization regularization sub-problems over $\{x_i\}_{i=1,2}$, respectively, and 3) obtaining the solution for x by a linear combination of $\{x_i\}_{i=1,2}$. This can include both variable splitting and operator splitting. Applicants refer to the process as a Composite Splitting Algorithm (CSA). Applying the effective acceleration scheme in FISTA (Beck, et al., 2009 II), the proposed CSA can be even further accelerated, e.g., by using an additional acceleration step.

Experiments have been conducted on real MR images to compare the proposed algorithm with previous methods. Experimental results have shown that the system and method according to aspects of embodiments of the disclosed subject matter outperforms previous methods for the MR image reconstruction in terms of both reconstruction accuracy and computation complexity.

According to aspects of embodiments of the disclosed subject matter, the two optimization techniques mentioned above are explored for their convergence complexity. Theoretical support for the algorithm convergence is discussed, which mathematically supports the benefits of the proposed system and method. Discussion of the experimental results includes comparisons, such as new data, CPU time, SNR and sample ratio, which serve to support the superior performance of the proposed system and method.

The system and method of the present application begins with FISTA as discussed in Beck, et al. 2009 II, which considers minimizing the following problem:

$$\min\{F(x) \equiv f(x) + g(x), x \in R^p\} \quad (2)$$

where $f$ is a smooth convex function with Lipschitz constant $L_f$, and g is a convex function which may be non-smooth.

ε-optimal Solution: Suppose x* is an optimal solution to (2) $x \in R^p$ is called an ε-optimal solution to (2) if F(x)−F(x*)≤ε holds.

---

Algorithm 1 FISTA Beck et al., 2009 II

Input: $\rho = 1/L_f$, $r^1 = x^0$, $t^1 = 1$
for k = 1 to K do
  $x_g = r^k - \rho \nabla f(r^k)$
  $x^k = \text{prox}_\rho(g)(x_g)$ $$t^{k+1} = \frac{1 + \sqrt{1 + 4(t^k)^2}}{2}$$

$$r^{k+1} = x^k + \frac{t^k - 1}{t^k + 1}(x^k - x^{k-1})$$

end for

---

Algorithm 2 CSD

Input: $\rho = 1/L$, $\alpha$, $\beta$, $z_1^0 = z_2^0 = x_g$
for j = 1 to J do
  $x_1 = \text{prox}_\rho(2\alpha||x||_{TV})(z_1^{j-1})$
  $x_2 = \text{prox}_\rho(2\beta||\Phi x||_1)(z_2^{j-1})$
  $x^j = (x_1 + x_2)/2$
  $z_1^j = z_1^{j-1} + x^j - x_1$
  $z_2^j = z_2^{j-1} + x^j - x_2$
end for

---

Gradient:

$\nabla f(x)$ denotes the gradient of the function $f$ at the point x.

The Proximal Map:

Given a continuous convex function g(x) and any scalar p>0, the proximal map associated with function g is defined as follows (Beck, et al., 2009 I) and (Beck, et al. 2009 II)

$$\text{prox}_\rho(g)(x) := \arg\min_u \left\{ g(u) + \frac{1}{2\rho}||u - x||^2 \right\} \quad (3)$$

Algorithm 1 outlines the FISTA (Beck, et al., 2009 II). It can obtain an ε-optimal solution in $\mathcal{O}(1/\sqrt{\varepsilon})$ iterations.

A Theorem from Beck, et al., (2009II) supposes that $\{x^k\}$ and $\{r^k\}$ are iteratively obtained by the FISTA which results in $$F(x^k) - F(x^*) \le \frac{2L_f||x^0 - x^*||^2}{(k+1)^2}, \forall x^* \in X_*$$

The efficiency of the FISTA highly depends on being able to quickly solve its second step $x^k = \text{prox}_\rho(g)(x_g)$. For simpler regularization problems, the FISTA can rapidly solve the L1 regularization problem with cost $\mathcal{O}(p \log(p))$ (Beck, et al., 2009 II) (where p is the dimension of (x), since the second step $x^k=\text{prox}_\rho(\beta\|\Phi x\|_1)(x_g)$ has a close form solution. One can also similarly quickly solve the TV regularization problem, since the $x^k=\text{prox}_\rho(\alpha\|x\|_{TV})(x_g)$ can be computed with cost $\mathcal{O}(p)$ (Beck, et al., 2009I). However, the FISTA algorithm cannot efficiently solve the composite L1 and TV regularization problem, the iterative refinement method and nonlinear inverse scale space MRI image reconstruction problem (1), since no efficient algorithm exists to solve the step $$x^k=\text{prox}_\rho(\alpha\|x\|_{TV}+\beta\|\Phi x\|_1)(x_g). \qquad (4)$$

To solve the iterative refinement method and nonlinear inverse scale space MRI image reconstruction problem, an efficient algorithm to solve this latest problem (4) is needed, for which the applicants propose that composite splitting techniques can be used to do this.

From the above introduction it can be seen that if one can develop a fast algorithm to solve problem (4), the MR image reconstruction problem can then be efficiently solved by the FISTA, which obtains an $\epsilon$-optimal solution in $\mathcal{O}(1/\sqrt{\epsilon})$ iterations. Actually, problem (4) can be considered as a denoising problem:

$$x^k = \operatorname*{argmin}_x \left\{ \frac{1}{2}\|x - x_g\|^2 + \rho\alpha\|x\|_{TV} + \rho\beta\|\Phi x\|_1 \right\}. \qquad (5)$$

Composite splitting techniques can be utilized to solve this problem (5) by, for example, 1) splitting the variable x into two variables $\{x_i\}_{i=1,2}$; 2) performing operator splitting over each of $\{x_i\}_{i=1,2}$ independently and 3) obtaining the solution x by linear combination of $\{x_i\}_{i=1,2}$. This can be considered to be a Composite Splitting Denoising ("CSD") method, which is outlined in Algorithm 2. Its validity is guaranteed by the following theorem:

Suppose $\{x^j\}$ is the sequence generated by the CSD. Then, $x^j$ will converge to $\text{prox}_\rho(\alpha\|x\|_{TV}+\beta\|\Phi x\|_1)(x_g)$, i.e. $x^j \to \text{prox}_\rho(\alpha\|x\|_{TV}+\beta\|\Phi x\|_1)(x_g)$.

Considering a more general formulation:

$$\min_{x\in R^p} F(x) \equiv f(x) + \sum_{i=1}^{m} g_i(B_i x)$$

where $f$ is the loss function and $\{g_i\}_{i=1,\ldots,m}$ are the prior models, both of which are convex functions; $\{B_i\}_{i=1,\ldots,m}$ are orthogonal matrices. Using a proposition from Combettes, et al. 2008, let H be a real Hilbert space, and let $$g = \sum_{i=1}^{m} g_i$$

in $\Gamma_0(H)$ such that $\text{dom}\, g_i \cap \text{dom}\, g_1 \neq \phi$. ("Proposition 2.1").

Let $r \in H$ and $\{x_j\}$ be generated by the Algorithm repeated below. Then, $x_j$ will converge to $\text{prox}(g)(r)$ as is discussed in Combettes, et al., 2008 and Combettes, 2009.

---

Algorithm 3 as in Combettes, et al., 2008

Input: $\rho, \{z_i\}_{i=1,\ldots,m} = r, \{w_i\}_{i=1,\ldots,m} = 1/m,$
for j = 1 to J do
  for i = 1 to m do
    $p_{ij} = \text{prox}_\rho(g_i / w_i)(z_i)$
  end for
  $p_j = \sum_{i=1}^{m} w_i p_{ij}$
  $q_{j+1} = z_j + q_j - x_j$
  $\lambda_j \in [0,2]$
  for i = 1 to m do
    $z_{ij+1} = z_{ij} + \lambda_j (2p_j - x_j - p_{ij})$
  end for
  $x_{j+1} = x_j + \lambda_j(p_j - x_j)$
end for

---

Suppose that $y_i=B_i x, s_i=B_i^\tau r$ and $h_i(y_i)=m\rho g_i(B_i x)$. Because the operators $(B_i)_{i=1,\ldots,m}$ are orthogonal, we can easily obtain that $$\frac{1}{2\rho}\|x - r\|^2 = \sum_{i=1}^{m} \frac{1}{2m\rho}\|y_i - s_i\|^2,$$

which can be transferred to:

$$\hat{y}_i = \operatorname*{argmin}_{y_i} \sum_{i=1}^{m} \left[\frac{1}{2}\|y_i - s_i\|^2 + h_i(y_i)\right], \qquad (7)$$

$$x = B_i^T y_i, \; i = 1, \ldots, m$$

The problem (7) can be solved by Algorithm 3. According to the above noted proposition (2.1), x will converge to prox (g)(r). Assuming $g_1(x)=\alpha\|x\|_{TV}$, $g_2(x)=\beta\|x_1\|$, m=2, w1=w2=½ and $\lambda_j=1$, one can obtain the proposed CSD algorithm, wherein x will converge to prox(g)(r), where $g=g_1+g_2=\alpha\|x\|_{TV}+\beta\|\Phi x\|_1$.

Combining the CSD with FISTA, a new algorithm FCSA is proposed according to aspects of embodiments of the disclosed subject matter for MR image reconstruction problem (1). In practice, it has been found that a small iteration number J in the CSD is enough for the FCSA to obtain good reconstruction results. Especially, it is set as 1 according to aspects of embodiments of the disclosed subject matter. Numerous experimental results have demonstrated that such a small iteration number can be good enough for real MR image reconstruction.

Algorithm 5 outlines the proposed FCSA. In this algorithm, if one removes the acceleration step by setting $t^{k+1} \equiv 1$ in each iteration, one can obtain the Composite Splitting Algorithm (CSA), which is outlined in Algorithm 4. A feature of the FCSA is its fast convergence performance borrowed from the FISTA.

From the above theorem 2.1, it can be seen that the FISTA can obtain an $\epsilon$-optimal solution in $\mathcal{O}(1\sqrt{\epsilon})$ iterations. Another feature of the FCSA is that the cost of each iteration is $\mathcal{O}(p \log(p))$ according to the following observations. Several FCSA steps only involve adding vectors or scalars, thus cost only $\mathcal{O}(p)$ or $\mathcal{O}(1)$. In step 1, $\nabla f(r^k=R^t(Rr^k-b))$ since $f(r^k)=\frac{1}{2}\|Rr^k-b\|^2$ this case. Thus, this step only costs $\mathcal{O}(p \log(p))$. As introduced above, the step $x^k=\text{prox}_\rho(2\alpha\|x\|_{TV})(x_g)$ can be computed quickly with cost $\mathcal{O}(p)$ (Beck, et al., 2009 I). The step $x^k=\text{prox}_\rho(2\beta\|\Phi x\|_1)(x_g)$ has a close form solution and can be computed with cost $\mathcal{O}(p \log(p))$. In the step $x^k$=project $(x^k, [l, u])$, the function x=project(x, [l, u]) is defined as: 1) x=x if l≤x≤u; 2) x=l if x<u; and 3) x=u if x>u, where [l, u] is the range of x. For example, in the case of MR image reconstruction, one can let l=0 and u=255 for 8-bit gray scale MR images. This step costs $\mathcal{O}(p)$. Thus, the total cost of each iteration in the FCSA is $\mathcal{O}(p \log(p))$.

With these two features, the FCSA can efficiently solve the MR image reconstruction problem (1) and can obtain better reconstruction results in terms of both the reconstruction accuracy and computation complexity. The experimental results discussed below demonstrate its superior performance compared with all previous methods for compressed MR image reconstruction.

Algorithm 4 CSA

Input: $\rho = 1/L, \alpha, \beta, t^1 = 1, x^0 = r^1$
for k = 1 to K do
    $x_g = r^k - \rho \nabla f(r^k)$
    $x_1 = \text{prox}_\rho (2\alpha \|x\|_{TV})(x_g)$
    $x_2 = \text{prox}_\rho (2\beta \|\Phi x\|_1)(x_g)$
    $x^k = (x_1 + x_2)/2$
    $x^k = \text{project}(x^k, [l, u])$
    $r^{k+1} = x^k$
end for Algorithm 5 FCSA Input: $\rho = 1/L, \alpha, \beta, t^1 = 1, x^0 = r^1$
for k = 1 to K do
    $x_g = r^k - \rho \nabla f(r^k)$
    $x_1 = \text{prox}_\rho (2\alpha \|x\|_{TV})(x_g)$
    $x_2 = \text{prox}_\rho (2\beta \|\Phi x\|_1)(x_g)$
    $x^k = (x_1 + x_2)/2; x^k = \text{project}(x^k, [l, u])$
    $t^{k+1} = (1 + \sqrt{1+4(t^k)^2})/2$
    $r^{k+1} = x^k + ((1^k - 1)/t^{k+1})(x^k - x^{k-1})$
end for Suppose an MR image x has n pixels, the partial Fourier transform R in the iterative refinement method and nonlinear inverse scale space MRI image reconstruction problem (1) consists of m rows of a n×n matrix corresponding to the full 2D discrete Fourier transform. The m selected rows correspond to the acquired b. The sampling ratio is defined as m/n. The scanning duration is shorter if the sampling ratio is smaller. In MR imaging, there exists a certain freedom to select rows, which correspond to certain frequencies. In conducting testing of the results of using the system and method of the disclosed subject matter, applicants selected the corresponding frequencies by, in the k-space, randomly obtaining more samples in low frequencies and less samples in higher frequencies, as is used on compressed MR image reconstruction (Lustig et al., 2007), (Ma et al., 2008) and (Yang, et al., 2010). Sampling scheme and speed in MR imaging also depends on physical and physiological limitations (Lustig et al., 2007).

According to aspects of the disclosed subject matter, applicants propose to implement CSA and FCSA for the solution of the iterative refinement method and nonlinear inverse scale space MRI image reconstruction problem (1) and have had this applied to 2D real MR images. The code that was used for the experiment is available for download. All experiments are conducted on a 2.4 GHz PC in Matlab environment. Applicants compared the CSA and FCSA with the classic MR image reconstruction method based on the CG (Lustig et al., 2007). We also compare them with two of the fastest MR image reconstruction methods, TVCMRI (Ma et al., 2008) and RecPF (Yang et al., 2010). The observation measurement b can be synthesized as b=Rx+n, where n is the Gaussian white noise with standard deviation σ=0.01. The regularization parameters α and β can be set as 0.001 and 0.035. R and b can be given as inputs, and x as the unknown target. For quantitative evaluation, the Signal-to-Noise Ratio (SNR) can be computed for each reconstruction result. Letting $x_0$ be the original image and x a reconstructed image, the SNR can be computed as: SNR=10 $\log_{10}(V_s/V_n)$, where $V_n$ is the Mean Square Error between the original image $x_0$ and the reconstructed image x: $V_s$=var($x_0$) denotes the power level of the original image where var($x_0$) denotes the variance of the values in $x_0$.

Applicants applied the test methods on four 2D MR images: cardiac, brain, chest and artery respectively, as shown in FIG. 1. For convenience, they have the same size of 256× 256. The sample ratio was set to be approximately 20%. To perform fair comparisons, all methods ran 50 iterations except that the CG runs fewer iterations due to its higher computational complexity. FIGS. 2, 3, 4 and 5 show the visual comparisons of the reconstructed results by different methods. The FCSA reconstruction was shown to obtain the best visual effects on all MR images in less CPU time. The CSA reconstruction was shown to be inferior to the FCSA, which shows the effectiveness of the acceleration steps in the FCSA reconstniction tbr the MR image reconstruction. The classical CG (Lustig et al., 2007) was shown to be less effective than others because of its higher cost in each iteration, the RecPF is slightly better than the TVCMRI, which is consistent with observations in (Ma et al., 2008) and (Yang et al., 2010).

In experiments relating to the disclosed subject matter, these methods have also been applied on the test images with the sample ratio set to 100%. It was observed that all methods obtain almost the same reconstruction results, with SNR 64.8, after sufficient iterations. This was to be expected, since all methods are essentially solving the same iterative refinement method and nonlinear inverse scale space MRI image reconstruction formulation, "Model (1)".

Figure 2:
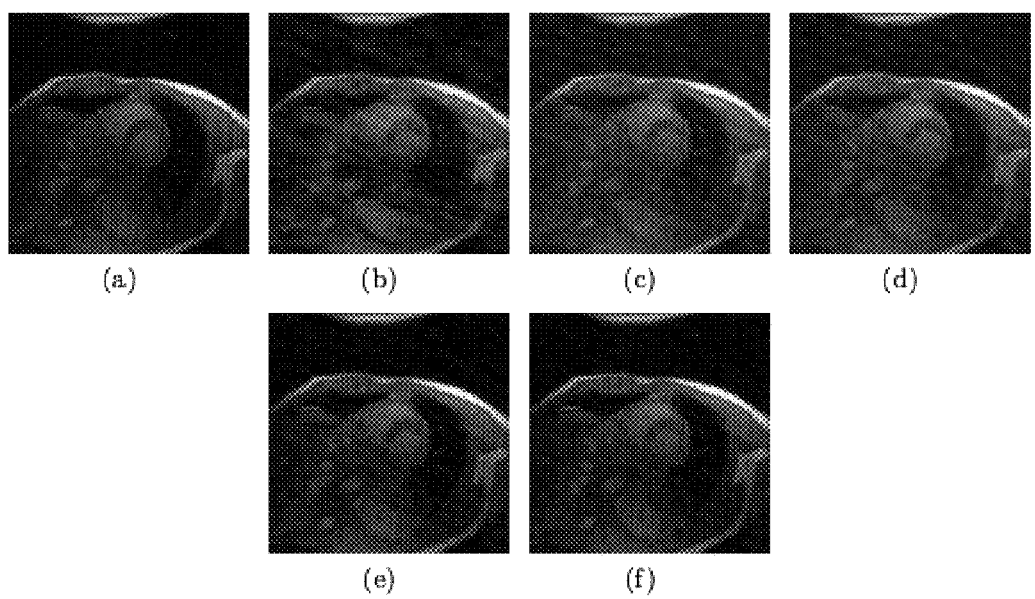
FIG. 2 shows a cardiac MR image reconstruction; (a) Original image; (b) CG reconstructed image; (c) TVCMRI reconstructed image; (d) RecPF reconstructed image; (e) CSA reconstructed image; and (f) FCSA reconstructed image.
Figure 3:
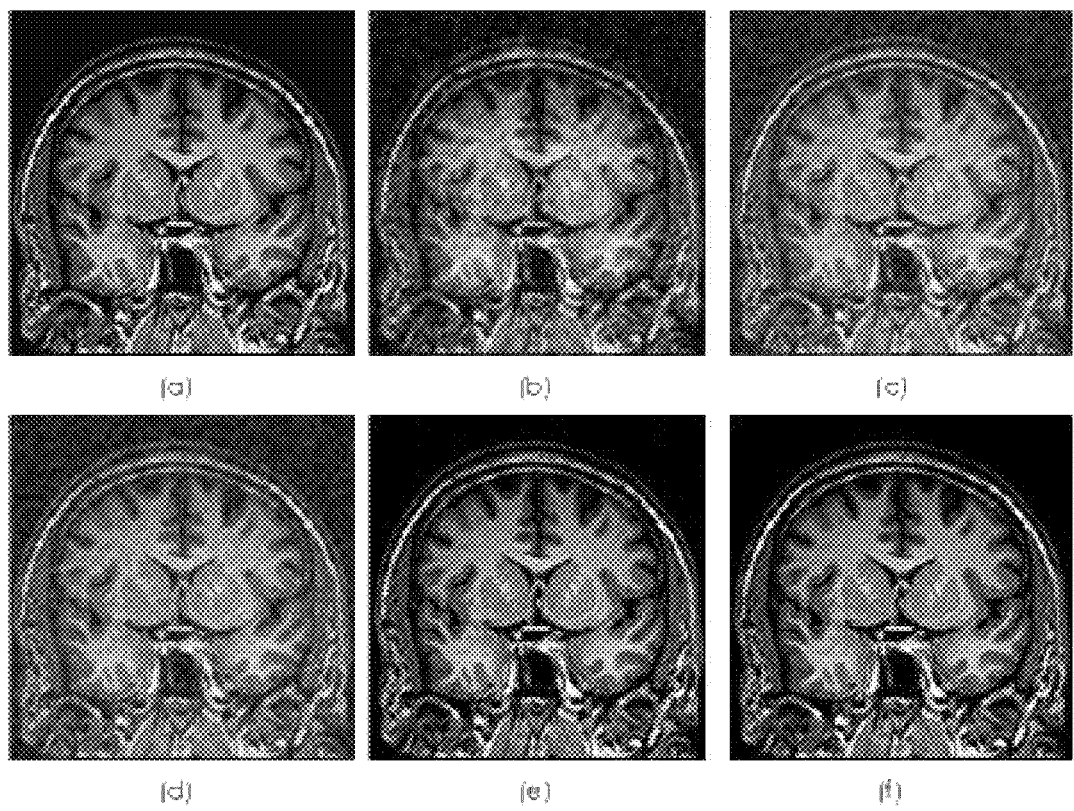
FIG. 3 shows a brain MR image reconstruction (a) Original image; (b) CG reconstructed image; (c) TVCMRI reconstructed image; (d)'RecPF reconstructed image; (e) CSA reconstructed image; and (f) FCSA reconstructed image.
Figure 4:
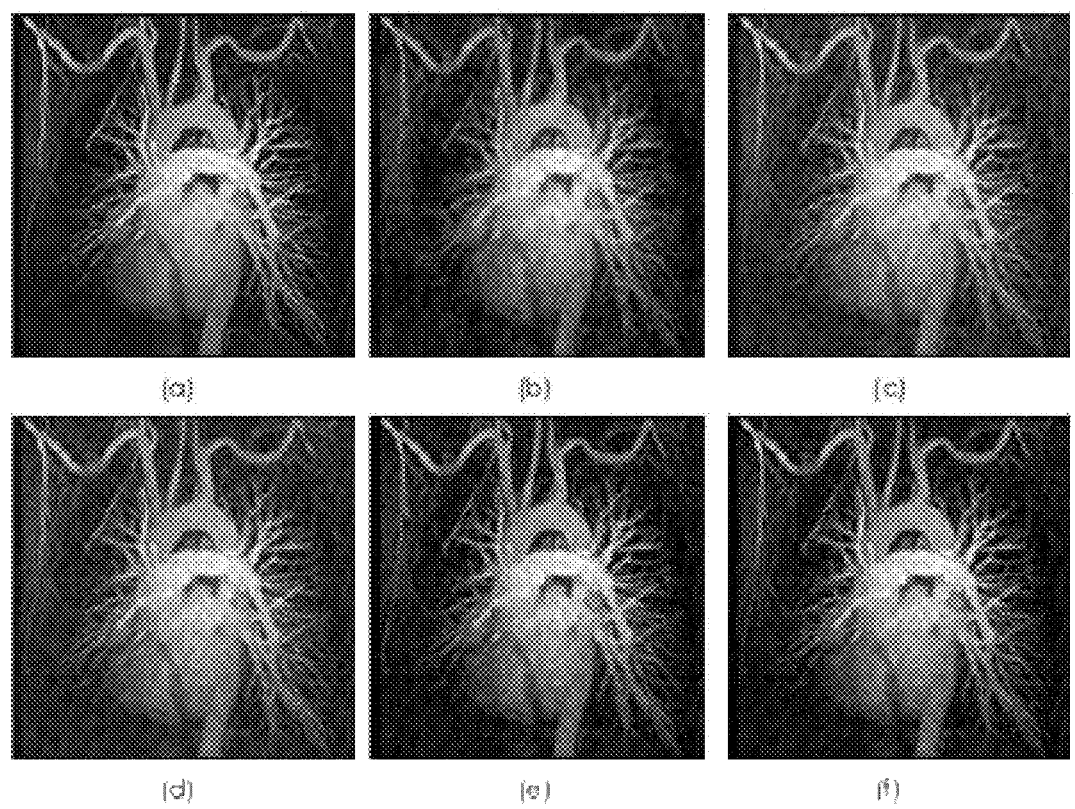
FIG. 4 shows a chest MR image reconstruction (a) Original image; (b) CG reconstructed image; (c) TVCMRI reconstructed image; (d) RecPF reconstructed image; (e) CSA reconstructed image; and (f) FCSA reconstructed image.
Figure 5:
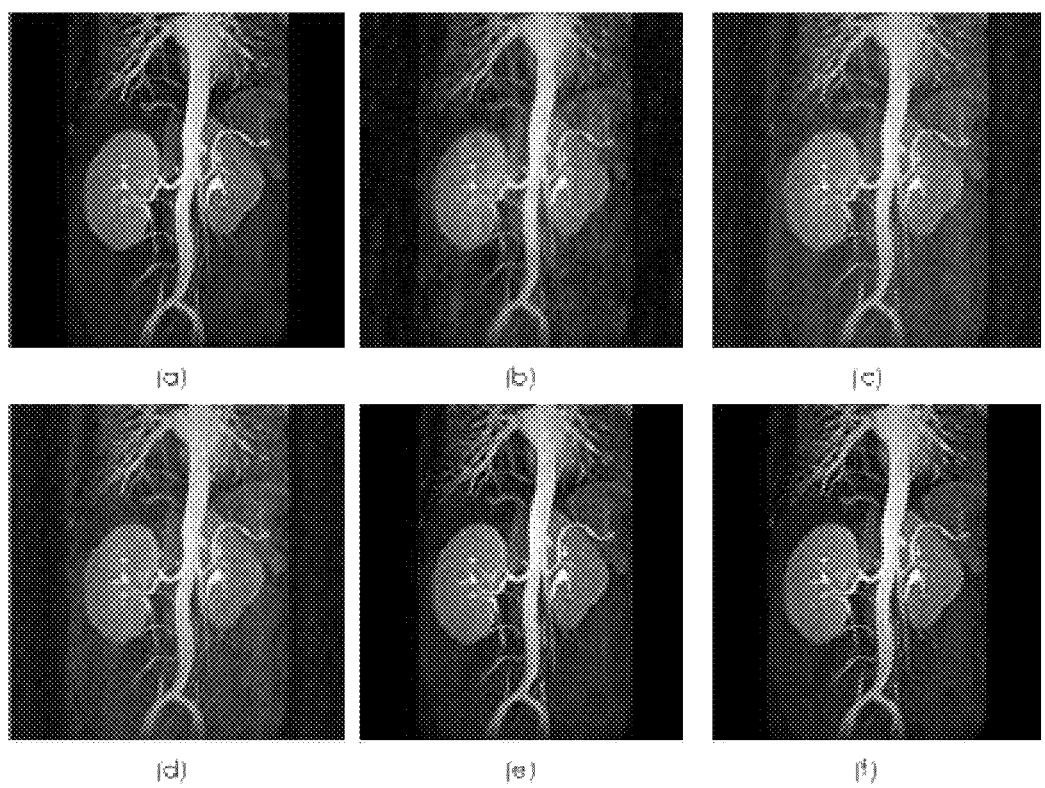
FIG. 5 shows an artery MR image reconstruction (a) Original image; (b) CG reconstructed image; (c) TVCMRI reconstructed image; (d) RecPF reconstructed image; (e) CSA reconstructed image; and (f) FCSA reconstructed image.
Figure 6:
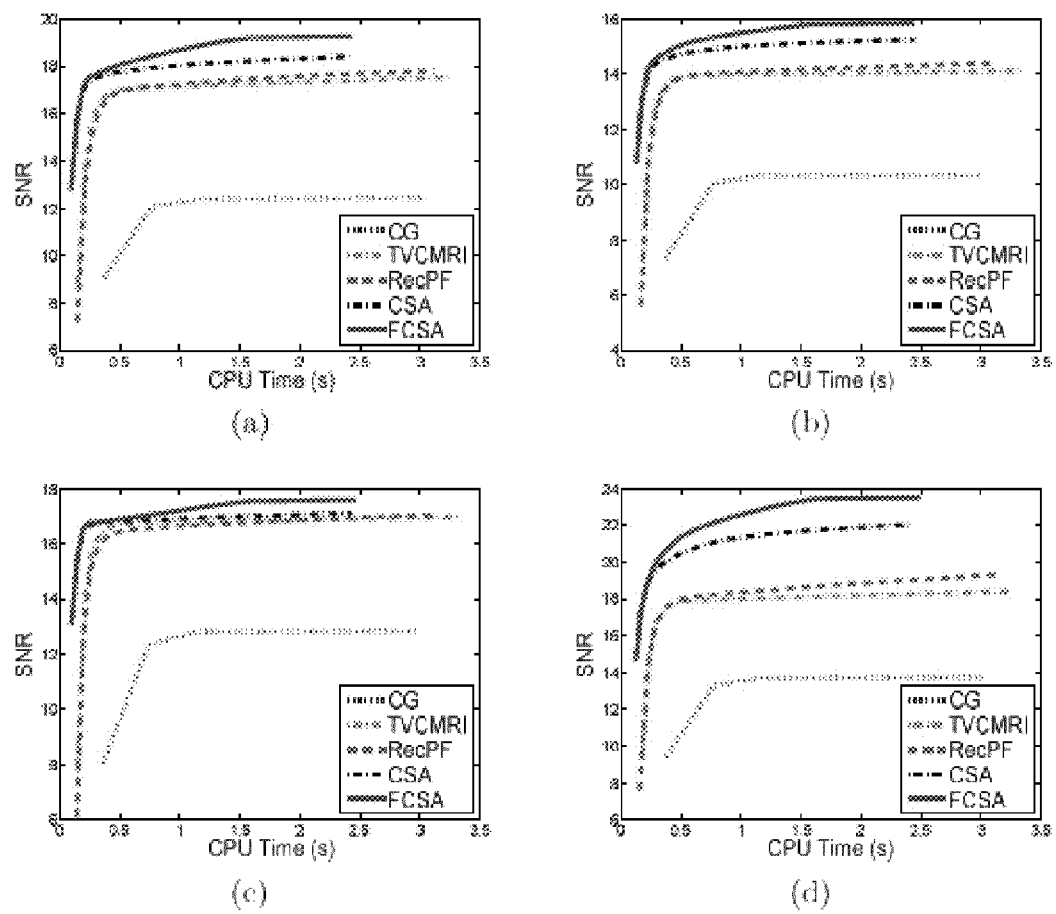
FIG. 6 shows performance comparisons (CPU-Time vs. SNR) for MR images (a) cardiac image; (b) brain image; (c) chest image; and (d) artery image.

FIG. 2 shows a cardiac MR image reconstruction from 20% sampling (a) Original image and (b), (c), (d) (e) and (f) are, respectively, the reconstructed images by the CG (Lustig et al., 2007), TVCMRI (Ma et al., 2008), RecPF (Yang et al., 2010), CSA and FCSA. Their SNRs are 9.86, 14.43, 15.20, 16.46 and 17.57 (db). Their CPU times are 2.87, 3.14, 3.07, 2.22 and 2.29(s). FIG. 3 shows a brain MR image reconstruction from 20% sampling (a) Original image and (b), (c), (d) (e) and (f) are, respectively, the reconstructed images by the CG (Lustig et al., 2007), TVCMRI (Ma et al., 2008), RecPF (Yang et al., 2010), CSA and FCSA. Their SNRs are 8.71, 12.12, 12.40, 18.68 and 20.35(db). Their CPU times are 2.75, 3.03, 3.00, 2.22 and 2.20(s). FIG. 4 shows a chest MR image reconstruction from 20% sampling (a) Original image and (b), (c), (d) (e) and (f), respectively, are the reconstructed images by the CG (Lustig et al., 2007). TVCMRI (Ma et al., 2008), RecPF (Yang et al., 2010), CSA and FCSA. Their SNRs are 11.80, 15.06, 15.37, 16.53 and 16.07(db). Their CPU time are 2.95, 3.03, 3.00, 2.29 and 2.234(s). FIG. 5 shows an artery MR image reconstruction from 20% sampling (a) Original image and (b), (c), (d) (e) and (f), respectively, are the reconstructed images by the CG (Lustig et al. 2007). TVCMRI (Ma et al. 2008), RecPF (Yang et al. 2010), CSA and FCSA. Their SNRs are 11.73, 15.49, 16.05, 22.27 and 23.70(db). Their CPU times are 2.78, 3.06, 3.20, 2.22 and 2.20(s). FIG. 6 shows performance comparisons (CPU-Time vs. SNR) on different MR images: a) cardiac image; (b) brain image; (c) chest image and (d) artery image. FIG. 6 gives the performance comparisons between different methods in terms of the CPU time over the SNR. Tables 1 and 2, respectively, tabulate the SNRs and CPU times.

TABLE 1

|  | CG | TVCMRI | RecPF | CSA | FCSA |
|---|---|---|---|---|---|
| Cardiac | 12.43 ± 1.53 | 17.54 ± 0.94 | 17.79 + 2.33 | 18.41 ± 0.73 | 19.26 ± 0.78 |
| Brain | 10.33 ± 1.63 | 14.11 ± 0.34 | 14.39 ± 2.17 | 15.25 ± 0.23 | 15.86 ± 0.22 |
| Chest | 12.83 ± 2.05 | 16.97 ± 0.32 | 17.03 ± 2.36 | 17.10 ± 0.31 | 17.58 ± 0.32 |
| Artery | 13.74 ± 2.28 | 18.39 ± 0.47 | 19.30 ± 2.55 | 22.03 ± 0.18 | 23.50 ± 0.20 |

TABLE 2

|  | CG | TVCMRI | RecPF | CSA | FCSA |
|---|---|---|---|---|---|
| Cardiac | 2.82 ± 0.16 | 3.16 ± 0.10 | 2.97 ± 0.12 | 2.27 ± 0.08 | 2.30 ± 0.08 |
| Brain | 2.81 ± 0.15 | 3.12 ± 0.15 | 2.95 ± 0.10 | 2.27 ± 0.12 | 2.31 ± 0.13 |
| Chest | 2.79 ± 0.16 | 3.00 ± 0.11 | 2.89 ± 0.07 | 2.21 ± 0.06 | 2.26 ± 0.07 |
| Artery | 2.81 ± 0.17 | 3.04 ± 0.13 | 2.94 ± 0.09 | 2.22 ± 0.07 | 2.27 ± 0.13 |

Time for the different methods in Table 2 was averaged over 100 runs for each experiment. The FCSA obtains the best reconstruction results on all MR images by achieving the highest SNR in less CPU time. The CSA methodology is shown to be inferior to the FCSA, which demonstrates the effectiveness of acceleration steps in the FCSA for the MR image reconstruction. While the classical CG (Lustig et al., 2007) is far worse than others because of its hit her cost in each iteration, the RecPF is slightly better than the TVCMRI, which is consistent to observations in (Ma et al., 2008) and (Yang et al., 2010).

Figure 7:
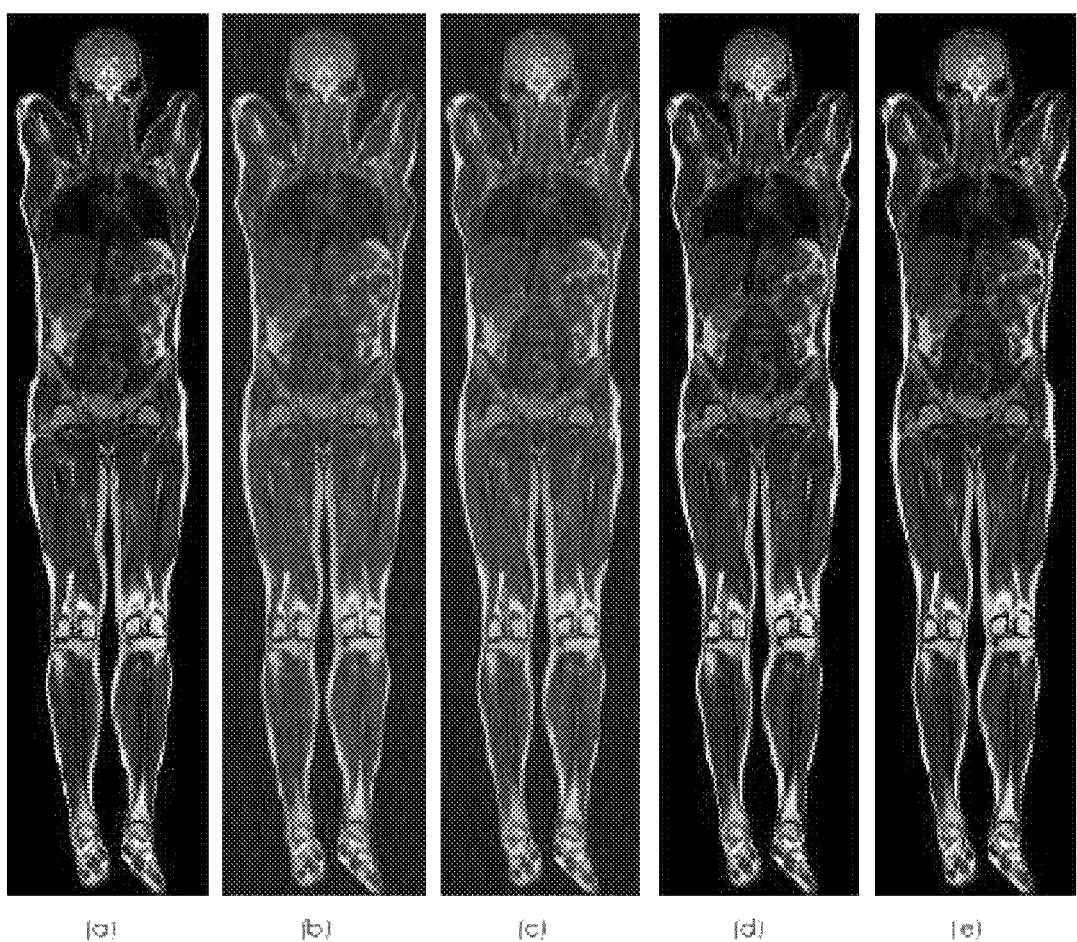
FIG. 7 shows a full body MR image reconstruction (a) Original image; (b) reconstructed TVCMRI image; (c) reconstructed RecPF image; (d) reconstructed CSA image; and (e) reconstructed FCSA image.
Figure 8A:
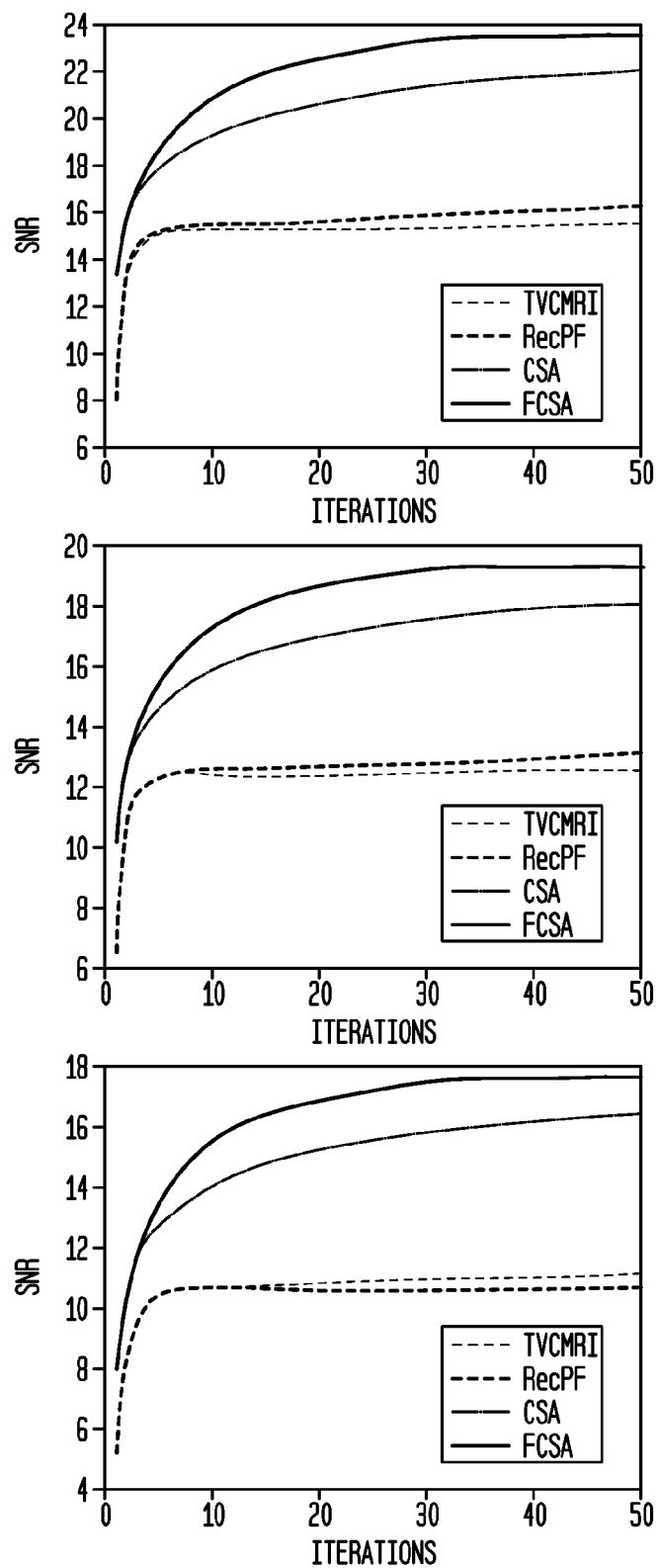
FIG. 8 shows performance comparisons (CPU-Time vs. SNR) between CG, TVCMRI, RecPF and FCSA methods.
Figure 8B:
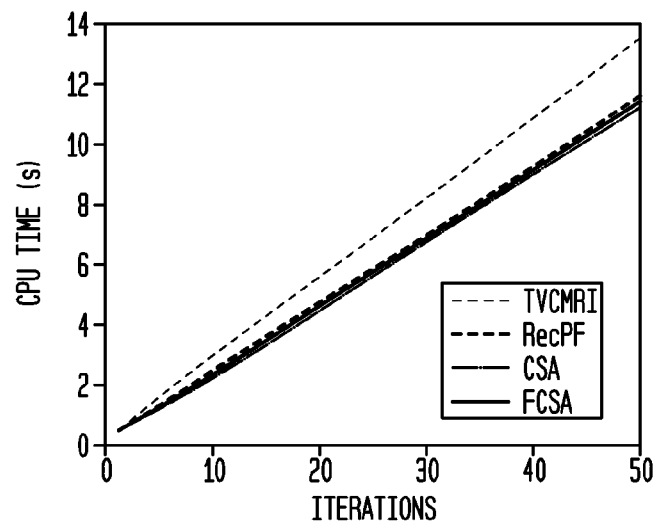
Figure 8B:
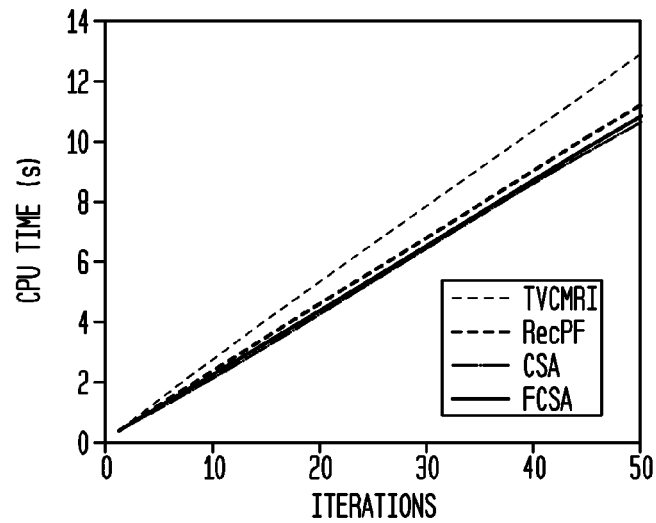
Figure 8B:
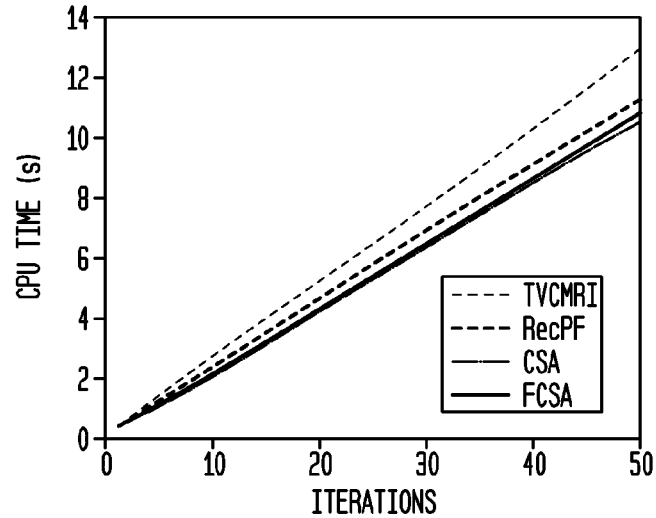

To test the efficiency of the proposed method, applicants further performed experiments on a full body MR image with size of 924×208. Each algorithm was run for 50 iterations. Since we have shown that the CG method is far less efficient than other methods, we will not include it in this experiment. The sample ratio was set to be approximately 25%. To reduce the randomness, applicants ran each experiment 100 times for each parameter setting of each method. The examples of the original and recovered images by different algorithms are shown in FIG. 7, which shows a full body MR image reconstruction from 25% sampling (a) Original image; and (b), (c), (d) and (e) are the reconstructed images by the TVCMRI (Ma et al., 2008). RecPF (Yang et al., 2010). CSA and FCSA. Their SNRs are 12.56, 13.06, 18.21 and 19.45 (db). Their CPU times are 12.57, 11.14, 10.20 and 10.64(s).

It can be observed that the results obtained by the FCSA are not only visibly better, but also superior in terms of both the SNR and CPU time. To evaluate the reconstruction performance with different sampling ratio, applicants used sampling ratio of 36%, 25% and 20% to obtain the measurement b respectively. Different methods can then be used to perform reconstruction. To reduce the randomness, each experiment was run 100 times for each parameter setting of each method. The SNR and CPU time are traced in each iteration for each methods, as illustrated in FIG. 8. FIG. 8 gives the performance comparisons between different methods in terms of the CPU time and SNR when the sampling ratios are 36%, 25% and 20% respectively. The reconstruction results produced by the FCSA can be seen to be far better than those produced by the CG, TVCMRI and RecPF. The reconstruction performance of the FCSA is seen to be the best in terms of both the reconstruction accuracy and the computational complexity, which further demonstrates the effectiveness and efficiency of the FCSA for compressed MR image construction.

The experimental results noted above validate the effectiveness and efficiency of the proposed composite splitting algorithms for compressed MR image reconstruction. It can be seen by those skilled in the art that applicants have proposed an efficient system and method, e.g. using (FCSA), to reconstruct compressed MR images. The system and method, e.g., by minimizing linear combination of three terms corresponding to a least square data fitting, total variation (TV) and L1 norm regularization, results in a computational complexity of the FCSA of $\mathcal{O}$ (p log(p)) in each iteration (p is the pixel number in the reconstructed image). The system and method also exhibits fast convergence properties. The system and method, as noted above, has been shown to significantly outperform the classic CG methods (Lustig et al., 2007) and two state-of-the-art methods (TVCMRI (Ma et al., 2008) and RecPF (Yang et al., 2010)) in terms of both accuracy and complexity.

According to aspects of the disclosed subject matter, the step size in the FCSA can be according to the inverse of the Lipschitz constant $L_f$. Using larger values is known to be a way of obtaining faster versions of the algorithm (Wright et al., 2009). According to aspects of embodiments of the disclosed and claimed subject matter, the proposed system and method is shown to efficiently solve the model (1) problem, which had previously been addressed by SparseMRI, TVCMRI and RecPF. Therefore, with enough iterations, SparseMRI, TVCMRI and RecPF can obtain the same solution as that obtained by the system and method of the present application, since they all solve the same formulation, and will lead to the same gain in information content. However, the system and method of the present application arrives at the solution faster with at least one of lower CPU time, higher SNL and lower frequency of sampling.

According to aspects of the disclosed and claimed subject matter, applicants have proposed an efficient algorithm for the compressed MR image reconstruction (model(1)) problem. Our work has the following contributions. First, the proposed FCSA can efficiently solve a composite regularization problem including both the TV term and L1 norm term, which can be easily extended to other medical image applications. The computational complexity of the system and method according to aspects of the disclosed subject matter, including, e.g., the FCSA, is only $\mathcal{O}$ (p log(p) in each iteration where p is the pixel number of the reconstructed image. The system and method allows for the real compressed MR image reconstruction as much more feasible than before.

It will be understood by those skilled in the art that system and method of reconstructing an image through solution of a data fitting problem, wherein the data fitting problem is not susceptible to efficient solution as a whole, is disclosed, which may comprise gathering, via a computing device, k-space image data, selecting a data fitting problem solution algorithm for the k-space data, decomposing the data fitting problem solution into a plurality of sub-problem solutions each susceptible to efficient solution separately for the k-space data, obtaining, via the computing device, the plurality of sub-problem solutions for the k-space data and reconstructing, via the computing device, the image based upon a weighted average of the plurality of sub-problem solutions for the k-space data.

The image may be a magnetic resonance image. The data fitting problem may comprise a minimization of a plurality of linear terms of a least square data fitting solution. The image may comprise under-sampled k-space image data. The fitting problem may comprise a composite regularization problem. The system and method may further comprise decomposing the composite regularization problem by splitting a variable into separate variables, and performing operator splitting on each of the sub-problems.

The image may comprise a magnetic resonance image comprising more samples within a first frequency band than within a second frequency band. The first frequency band may comprise lower frequencies than the second frequency band. The system and method may comprise minimizing, via the computing device, a linear combination of three terms corresponding to a least square data fitting, a total variation (TV) and an L1 normalization regularization. The system and method may comprise decomposing a problem solution into the TV and L1 normalization regularization sub-problems respectively; and solving, via the computing device, the sub-problems.

The system and method may comprise solving $x^k = \text{prox}_\rho(\alpha\|x\|_{TV} + \beta\|\Phi x\|_1)(x_g)$, via a computing device, where x is an unknown target, k is an integer from 1 to K, $\rho$ is a scalor factor, $\alpha$ and $\beta$ are two positive regularization parameters and $\Phi x$ is a wavelet transform; and applying, via the computing device, FISTA to the results to obtain a $\epsilon$-optimal solution.

As used in this application, and as is well understood by those skilled in the art, the term "computing device." such as may form a part of a system or be utilized to perform method steps as part of a method, according to aspects of an embodiment of the disclosed subject matter for reconstructing images, by way of example, may comprise a computer processor or other processor unit capable of obtaining and executing instructions, such as application and operating system software instructions. The processor may be any form of hardware device for executing software instructions which may be stored in and obtained from a storage medium, such as cache memory, main memory, local disc storage and remote disc or other storage and may reside in different ones of such types of storage media at the same time or at different times.

The processor may be any custom made or commercially available processor, a central processing unit (CPU), an auxiliary processor among several processors associated with the processing unit, a semiconductor based microprocessor (in the form of a microchip or chip set), a macroprocessor, a microcontroller, an array of processors, a networked group or array of computing devices or generally any device(s) for executing software instructions. The processor may comprise a controller, microcontroller, or a hard wired, including firmware, device, or any combination thereof, or any other processor capable of performing logic driven operations, according to partly or fully programmable instructions.

As is also well understood by those skilled in the art, software operating on the processor may include one or more separate programs, each of which comprises an ordered listing of executable instructions for implementing logical functions. Software may be in the form of application software and operating system software which is stored in a tangible medium, such as any of the storage media (memories) noted above. The operating system essentially controls the execution of other computer programs by the computing device. Software may be written and compiled as (a) an object oriented programming language, which has classes of data and methods, or (b) a procedure programming language, which has routines, subroutines, and/or functions, such as C, C++, Pascal, Basic, Fortran, Cobol, Perl, Java, and Ada or standard Internet languages, such as XML or HTML.

In the context of this disclosure, a tangible computer readable medium may be any electronic, magnetic, optical, or other physical device or means that can contain or store a computer program instructions for use by or in connection with a computing device related system or method. The tangible computer readable medium can be, for example, but not limited to, an electronic, magnetic, optical, electromagnetic, infrared, or semiconductor system, apparatus, device, or other non-transitory propagation medium, including, by way of example an electrical connection (electronic) having one or more wires, a portable computer diskette (magnetic), a random access memory (RAM) (electronic), a read-only memory (ROM) (electronic), an erasable programmable read-only memory (EPROM) (electronic), an electronically erasable programmable read only memory ("EEPROM") (electronic), a Flash memory (electronic), an optical fiber memory (optical), a portable compact disc read-only memory (CDROM) (optical), a tape (magnetic), a large disc storage medium (magnetic), etc., all as is known and understood by those skilled in the art.

For the purposes of this disclosure a module is a software, hardware, or firmware (or combinations thereof) system, process or functionality, or component thereof, that performs or facilitates the processes, features, and/or functions described herein of a module (with or without human interaction or augmentation). A module can include sub-modules. Software components of a module may be stored on a computer readable medium as noted above. Modules may be integral to one or more servers, or be loaded and executed by one or more servers. One or more modules may be grouped into an engine or an application.

For the purposes of this disclosure the term "server" should be understood to refer to a service point which provides processing, database, and communication facilities, again, as is well known and understood by those in the art. By way of example, and not limitation, the term "server" can refer to a single physical processor with associated communications and data storage and database facilities, or it can refer to a networked or clustered or arrayed complex of processors including massively parallel and pipelined processors, and associated network, communication and storage devices, as well as operating software and one or more database systems and applications software which support the services provided by the server, all of which may be also referred to as a computing device or a communication device, as may be consistent with the context of the system and method being described or claimed.

Depending upon the context in which described or claimed a communication device or communication network, as will be understood by those in the art, may be more than one physical device operating to carry out the communication function described, such as any one of a number of computing devices such as PCs, MACS, PDAs, etc. interfaced to communications networks, such as the Internet, or any number of hand held portable communications devices, such as a cellular phone, Blackberry, I-Pod, Droid, or groups, arrays or networks thereof, interconnected directly or indirectly, such as through a LAN and/or a gateway, to communications network stations and facilities, such as through cellular phone base stations, the Internet, the public switched network, etc. Any or all of such components of a communication device/ system acting in series or in parallel, or combinations thereof, with associated transmitting and receiving equipment, coding and decoding equipment, encryption and decryption equipment, modulating and demodulating equipment, computing devices, data bases and the like equipment, necessary for, and capable of, carrying out the disclosed or claimed communication referenced in the present application.

What is claimed is:

1. A method of reconstructing an image through solution of a data fitting problem, wherein the data fitting problem is not susceptible to efficient solution as a whole, comprising:
    gathering, via a computing device, k-space image data;
    selecting a data fitting problem solution algorithm for the k-space data;
    decomposing the data fitting problem solution into a plurality of sub-problem solutions each susceptible to efficient solution separately for the k-space data, wherein decomposing the data fitting problem comprises splitting a first variable into at least two variables;
    obtaining, via the computing device, the plurality of sub-problem solutions for the k-space data, wherein obtaining the plurality of sub-problem solutions comprises performing operator splitting over each of the at least two variables independently; and
    reconstructing, via the computing device, the image based upon a weighted average of the plurality of sub-problem solutions for the k-space, wherein reconstructing the image comprises obtaining a solution for the first variable by a linear combination of the plurality of sub-problem solutions.

2. The method of claim 1, wherein, the image is a magnetic resonance image.

3. The method of claim 1 wherein the data tilting problem comprises a minimization of a plurality of linear terms of a least square data fitting solution.

4. The method of claim 1 wherein the image comprises under-sampled k-space image data.

5. The method of claim 1 wherein the fitting problem comprises a composite regularization problem.

6. The method of claim 4, wherein the image comprises a magnetic resonance image comprising more samples within a first frequency band than within a second frequency band.

7. The method of claim 6 further comprising the first frequency band comprising lower frequencies than the second frequency band.

8. The method of claim 1 further comprising:
    minimizing, via the computing device, a linear combination of three terms corresponding to a least square data fitting, a total variation (TV) and an L1 normalization regularization.

9. The method of claim 1 further comprising:
    decomposing a problem solution into the TV and L1 normalization regularization sub-problems respectively; and
    solving, via the computing device, the sub-problems.

10. The method of claim 1, further comprising:
    solving $x^k = \text{prox}_\rho(\alpha\|x\|_{TV} + \beta\|\Phi x\|_1)(x_g)$, via the computing device, where x is an unknown target, k is an integer from 1 to K, $\rho$ is a scalor quantity, $\alpha$ and $\beta$ are regularization parameters and $[\Phi x]$ is a wavelet transform; and
    applying, via the computing device, FISTA to the results to obtain a $\epsilon$-optimal solution.

11. A system for reconstructing an image through solution of a data fitting problem, wherein the data fitting problem is not susceptible to efficient solution as a whole, comprising:
    a computing device configured to gather k-space image data;
    the computing device configured to run a data fitting problem solution algorithm for the k-space data, wherein the data fitting problem solution is decomposed into a plurality of sub-problem solutions each susceptible to efficient solution separately for the k-space data, wherein decomposing the data fitting problem comprises splitting a first variable into at least two variables;
    the computing device configured to obtain the plurality of sub-problem solutions for the k-space data, wherein obtaining the plurality of sub-problem solutions comprises performing operator splitting over each of the at least two variables independently; and
    the computing device configured to reconstruct the image based upon a weighted average of the plurality of sub-problem solutions for the k-space data, wherein reconstructing the image comprises obtaining a solution for the first variable by a linear combination of the plurality of sub-problem solutions.

12. The system of claim 10, wherein, the image is a magnetic resonance image.

13. The system of claim 12 wherein the data fitting problem comprises a minimization of a plurality of linear terms of a least square data fitting solution.

14. The system of claim 12 wherein the image comprises under-sampled k-space image data.

15. The system of claim 12 wherein the fitting problem comprises a composite regularization problem.

16. The system of claim 14, wherein the image comprises a magnetic resonance image comprising more samples within a first frequency band than within a second frequency band.

17. The system claim 11 further comprising the first frequency band comprising lower frequencies than the second frequency band.

18. A method of reconstructing an image through solution of a data fitting problem, wherein the data fitting problem is not susceptible to efficient solution as a whole, comprising:
    gathering, via a computing device, k-space image data;
    selecting a data fitting problem solution algorithm for the k-space data;
    decomposing the data fitting problem solution into a plurality of sub-problem solutions each susceptible to efficient solution separately for the k-space data;
    obtaining, via the computing device, the plurality of sub-problem solutions for the k-space data;
    reconstructing, via the computing device, the image based upon a weighted average of the plurality of sub-problem solutions for the k-space;
    solving $x^k = \text{prox}_\rho(\alpha\|x\|_{TV} + \beta\|\Phi x\|_1)(x_g)$, via the computing device, where x is an unknown target, k is an integer from 1 to K, $\rho$ is a scalor quantity, $\alpha$ and $\beta$ are regularization parameters and $[\Phi x]$ is a wavelet transform; and
    applying, via the computing device, FISTA to the results to obtain a $\epsilon$-optimal solution for reconstructing the image.

* * * * *